(12) United States Patent
Wang et al.

(10) Patent No.: US 7,109,085 B2
(45) Date of Patent: Sep. 19, 2006

(54) ETCHING PROCESS TO AVOID POLYSILICON NOTCHING

(75) Inventors: Shiang-Bau Wang, Taoyuan (TW); Li-Te Lin, Hsinchu (TW); Ming-Ching Chang, Taipei (TW); Ryan Chia-Jen Chen, Chiayi (TW); Yuan-Hung Chiu, Hsin-Chu (TW); Hun-Jan Tao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/033,912

(22) Filed: Jan. 11, 2005

(65) Prior Publication Data
US 2006/0154487 A1    Jul. 13, 2006

(51) Int. Cl.
*H01L 21/336*    (2006.01)
(52) U.S. Cl. .................. 438/279; 438/308; 438/714
(58) Field of Classification Search ........ 438/275–308, 438/710–714
See application file for complete search history.

(56) References Cited

U.S. PATENT DOCUMENTS

2002/0151183 A1* 10/2002 Yang et al. .................. 438/714

* cited by examiner

Primary Examiner—H. Jey Tsai
(74) Attorney, Agent, or Firm—Tung & Associates

(57) ABSTRACT

A method for plasma assisted etching of a polysilicon containing gate electrode to reduce or avoid polysilicon notching at a base portion including providing a semiconducting substrate; forming a gate dielectric layer on the semiconducting substrate; forming a polysilicon layer on the gate dielectric; patterning a photoresist layer over the polysilicon layer for etching a gate electrode; carrying out a first plasma assisted etch process to etch through a major thickness portion of the polysilicon layer; carrying out a first inert gas plasma treatment; carrying out a second plasma assisted etch process to include exposing portions of the underlying gate dielectric layer; carrying out a second inert gas plasma treatment; and, carrying out a third plasma assisted etch process to fully expose the underlying gate dielectric layer adjacent either side of the gate electrodes.

27 Claims, 4 Drawing Sheets

ETCHING PROCESS TO AVOID POLYSILICON NOTCHING

FIELD OF THE INVENTION

This invention generally relates to plasma enhanced etching in integrated circuit manufacturing processes including reactive ion etching (RIE) of polysilicon features and more particularly to RIE of polysilicon gate electrodes to reduce or prevent polysilicon notching to improve CMOS device performance and yield.

BACKGROUND OF THE INVENTION

As devices become smaller and integration density increases, reactive ion etching (RIE) has become a key process in anisotropic etching of semiconductor features. RIE or ion-enhanced etching works by a combination of physical and chemical mechanisms for achieving selectivity and anisotropicity during the etching process. Generally, RIE operates in the milliTorr range and above. Generally, three processes compete with each other during plasma etching; physical bombardment by ions, chemical etching by radicals and ions, and surface passivation by the deposition of passivating films. In some applications, for example, etching high aspect ratio features, high density plasma (HDP) etching having a higher density of ions and operating at lower pressures has been increasingly used in etching high aspect ratio features, for example, having aspect ratios greater than about 3:1.

An increasingly problematical phenomenon in RIE processes is notching, also referred to as micro-trenching, at the base of a polysilicon feature overlying another material, such as an oxide. For example, as device characteristic dimensions decrease, the precise formation of polysilicon gate critical dimensions as well as avoiding damage to the underlying gate dielectric portion is increasingly critical to satisfactory operation of CMOS devices.

Although the reason for notching is not precisely understood and has been a long-standing processing problem, adequate solutions to overcome the problem have to date been less than adequate. Several phenomena including the formation and accumulation of localized charge imbalances during etching are believed to contribute to preferential etching at the base of a polysilicon gate feature. In addition, the simultaneous etching of an underlying oxide layer is believed to create undesirable reactive ion species that contribute to the problem of micro-trenching or undesirable preferential etching at the base of gate electrode feature. While attempts in the prior art to address the problem have including altering etching conditions and chemistries, and schemes have been proposed to reduce charge imbalance accumulation, an adequate solution for etching polysilicon gate structures with required critical dimensions in the absence of micro-trenching remains a problem to be overcome.

In addition, the problem of micro-trenching is particularly problematical where both NMOS and PMOS gate electrode structures are formed in parallel in a single RIE etching process. One particular micro-trenching phenomenon involves the formation of a 'notch' (decrease in the gate electrode width) at the base of the polysilicon electrode where the degree of notching may depend in part on the dopant type of the polysilicon. In addition, damage to the underlying gate dielectric can occur in overetching processes. Etching defects including notches adversely affect critical electrical properties of CMOS devices including decreased dielectric breakdown strength, Voltage threshold variations, and current leakage.

There is therefore a need in the semiconductor processing art to develop an improved method for plasma assisted etching of polysilicon including gate electrodes to achieve improved etching profiles while avoiding the formation of preferential etching defects to thereby improve semiconductor device reliability and yield.

It is therefore an object of the invention to provide an improved method for plasma assisted etching of polysilicon including gate electrodes to achieve improved etching profiles while avoiding the formation of preferential etching defects to thereby improve semiconductor device reliability and yield, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for plasma assisted etching of a polysilicon containing gate electrode to reduce or avoid polysilicon notching at a base portion.

In a first embodiment, the method includes providing a semiconducting substrate; forming a gate dielectric layer on the semiconducting substrate; forming a polysilicon layer on the gate dielectric; patterning a photoresist layer over the polysilicon layer for etching a gate electrode; carrying out a first plasma assisted etch process to etch through a major thickness portion of the polysilicon layer; carrying out a first inert gas plasma treatment; carrying out a second plasma assisted etch process to include exposing portions of the underlying gate dielectric layer; carrying out a second inert gas plasma treatment; and, carrying out a third plasma assisted etch process to fully expose the underlying gate dielectric layer adjacent either side of the gate electrodes.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to SRAM NMOS and PMOS devices, it will be appreciated that the method of the present invention may be applied to the formation of any MOSFET device including the formation of a polysilicon gate electrode according to a plasma assisted anisotropic etching process where an etching profile of the polysilicon gate electrode may be advantageously improved to avoid preferential etching defects including the formation of notches at a base portion of the polysilicon gate electrode.

Figure 1A:
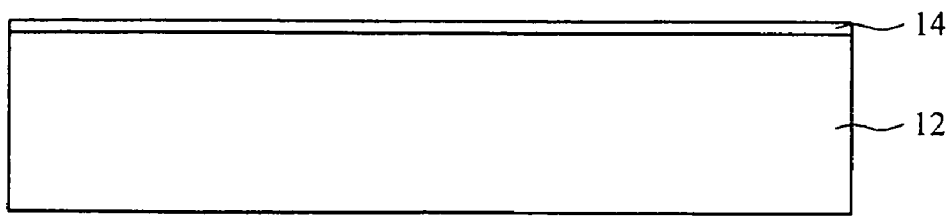
FIGS. 1A–1E are cross sectional schematic representations of an exemplary portion of a CMOS device including NMOS and PMOS portions formed in parallel at stages of manufacture according to an embodiment of the present invention.

Referring to FIGS. 1A–1E, in an exemplary embodiment of the method of the present invention, are shown cross-sectional schematic views of a portion of a semiconductor wafer during stages in production of CMOS gate structures including NMOS and PMOS devices. For example, referring to FIG. 1A is shown a substrate 12, which may include silicon, polysilicon, strained semiconductor, compound semiconductor, multi-layered semiconductors, or combinations thereof. For example, the substrate 12 may include, but is not limited to, silicon on insulator (SOI), stacked SOI (SSOI), stacked SiGe on insulator (S—SiGeOI), SiGeOI, and GeOI, or combinations thereof. In a preferred embodiment, the substrate upper portion underlying the gate dielectric layer 14, includes single crystalline or polycrystalline silicon (polysilicon).

Still referring to FIG. 1A, a gate dielectric layer 14 is formed over the substrate 12 by conventional methods. For example, the gate dielectric layer 14 is preferably formed of silicon dioxide ($SiO_2$), but may be formed of, silicon oxynitride, silicon nitride, nitrogen doped silicon dioxide, high-K dielectrics, or combinations thereof. The high-K dielectrics may include metal oxides, such as metal silicates, metal oxynitrides, transition metal-oxides, transition metal silicates, metal aluminates, and transition metal oxynitrides, or combinations thereof. The gate dielectric layer 14 may be formed by any process known in the art, e.g., thermal oxidation, nitridation, sputter deposition, or chemical vapor deposition. The physical thickness of the gate dielectric may be in the range of 5 to 100 Angstroms. When using a high permittivity (high-K) gate dielectric, the dielectric constant is preferably greater than about 10. The high-K dielectric, for example an oxide, may include one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. In a preferred embodiment, the gate dielectric layer 14 includes silicon dioxide which aids in formation of a silicon oxide passivation layer during an RIE etching process as outlined below.

Figure 1B:
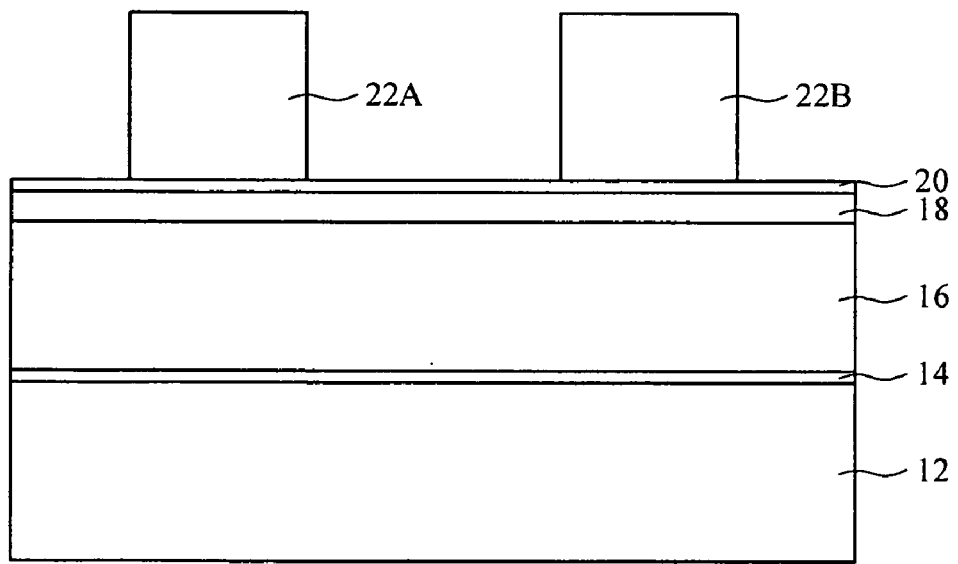

Referring to FIG. 1B, a gate electrode layer 16 is then formed on the gate dielectric layer 14, preferably polysilicon containing, which may include crystalline or amorphous polysilicon, doped or undoped polysilicon, for example doped with N or P type dopants, or polysilicon compound semiconductors such as polysilicon-germanium. The gate electrode layer 16 is deposited to a thickness of about 500 Angstroms to about 3000 Angstroms. In an exemplary embodiment, a hardmask layer 18 including one or more of silicon dioxide, silicon nitride and silicon oxynitride, e.g., deposited by a PECVD or LPCVD process, is then optionally formed over the polysilicon layer 16. In addition, an organic or inorganic (e.g., SiON, SiOC) bottom anti-reflective coating (BARC) layer 20 may optionally be deposited on the hardmask layer 18 prior to forming and patterning an overlying photoresist layer. A photoresist layer is then formed and patterned to leave photoresist layer portions e.g., 22A, 22B overlying portions of the polysilicon layer 16 which will subsequently form gate electrode portions following a multi-step plasma assisted etching (e.g., RIE) process outlined below.

Figure 1C:
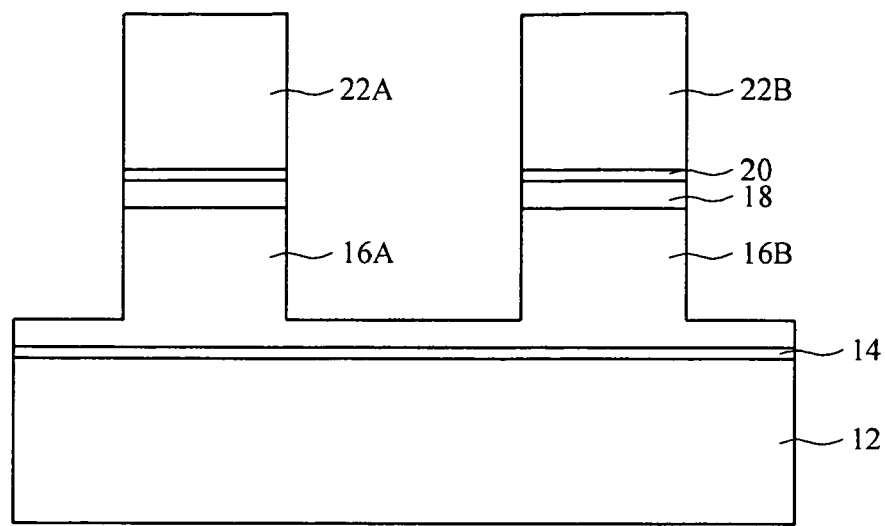

Referring to FIG. 1C, a multi-step RIE etching process is carried out including etching through the BARC layer 20 and hardmask layer 18, followed by a main polysilicon etching process to etch through a major thickness portion of the polysilicon layer 16 to form polysilicon gate electrode portions e.g., 16A, 16B, preferably stopping about 100 Angstroms to about 300 Angstroms above the gate dielectric layer 14, also referred to as a soft landing.

For example, in an exemplary multi-step etching process, in a first step of the multi-step RIE etching process, the BARC layer 20 and hardmask layer 18 are etched through a thickness using a $CF_4$ containing etching chemistry to expose portions of the underlying polysilicon layer 16. Exemplary RIE etching parameters include a plasma pressure of about 2 to about 15 milliTorr using $CF_4$ at a flow rate of about 20 to about 120 sccm. The RF source power is preferably supplied between about 100 to about 1000 Watts including a RF bias power at about 10 to about 200 Watts.

In the main polysilicon etch step, the polysilicon layer 16 is then etched through a major thickness portion of the polysilicon layer e.g., at least about ¾ of the polysilicon layer 16 thickness, preferably to within about 100 Angstroms to about 300 Angstroms above the bottom of the polysilicon layer 16. The main polysilicon etch step may include a $HBr/Cl_2$ etching chemistry with optional additions of one or more of $CF_4$, $O_2$, and an inert gas, preferably helium (He), for example $HBr/Cl_2/O_2/He$, $HBr/Cl_2/He$, or $CF_4/Cl_2/O_2$. Exemplary RIE etch parameters for the main etching step include a plasma pressure of about 2 to about 30 milliTorr using $CF_4$ at a flow rate of about 5 to about 100 sccm, $Cl_2$ at a flow rate of between about 15 and about 150 sccm, HBr at a flow rate of about 20 to about 200 sccm, and helium and oxygen each at a flow rate of about 3 to about 30 sccm. The RF source power is preferably supplied between about 100 to about 500 Watts, including a RF bias power at about 0 to about 200 Watts. Alternatively the main polysilicon etch process may be include a fluorocarbon/oxygen etching chemistry, where exemplary plasma etching conditions include a plasma pressure of from about 5 to about 100 milliTorr, an RF source power of about 200 to about 1000 Watts, an RF bias power of about 0 to about 100 Watts, and a flow rate of $CF_4$ and $O_2$ each from about 20 to about 200 sccm.

Still Referring to FIG. 1C, following etching through a major thickness portion of the polysilicon layer 16 with a soft landing to form polysilicon gate electrode portions 16A and 16B, according to an important aspect of the invention, a first inert gas plasma treatment is carried out using one or more inert gases such as argon, helium, neon, and the like, most preferably argon, which acts to sputter out polymer species from chamber walls and wafer surfaces, causing redeposition of the polymer species on polysilicon electrode sidewalls to prevent notching at the base of the polysilicon electrode in subsequent etching processes.

For example, the first inert gas plasma treatment is carried out from about 15 seconds to about 45 seconds, preferably with zero RF bias power supplied and with an RF source power of about 200 Watts to about 1200 Watts at a pressure of about 10 milliTorr to about 200 milliTorr.

Figure 1D:
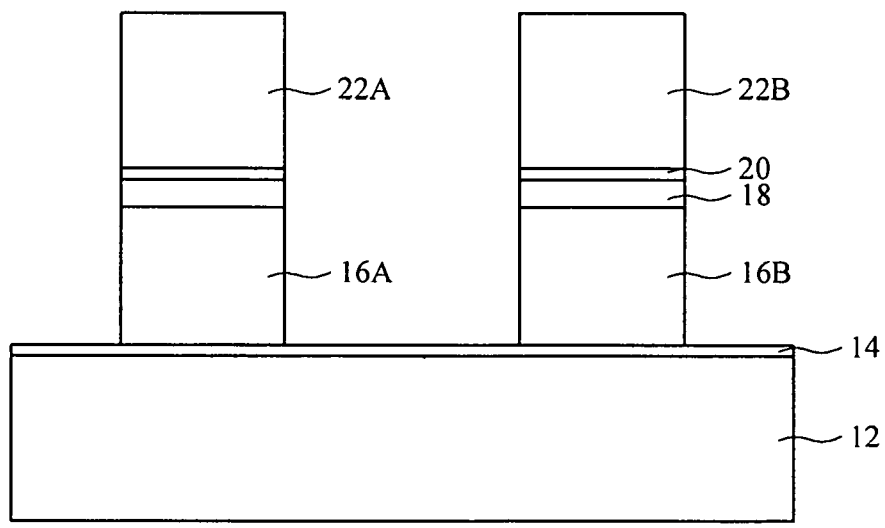

Referring to FIG. 1D, a first overetch process is then carried out preferably to reveal portions of the underlying gate dielectric layer 14, preferably an oxide, most preferably silicon dioxide. The first overetch process is preferably carried out with a chlorine-free etching chemistry, for example a fluorocarbon/oxygen or HBr/oxygen etching chemistry. For example, the rate of chlorine etching has been found to be influenced by polysilicon doping, thus resulting in variable etching rates for the n-doped and p-doped polysilicon gates, contributing to the formation of preferential etching of the polysilicon gates. Exemplary RIE etching conditions for the first overetch process include a plasma pressure of about 10 to about 100 milliTorr, an RF source power of about 200 to about 1000 Watts, no (zero) RF bias power applied and an HBr flow rate of about 20 to about 200 sccm including an inert gas such as helium or argon, and oxygen each at about 2 to about 15 sccm.

Figure 1E:
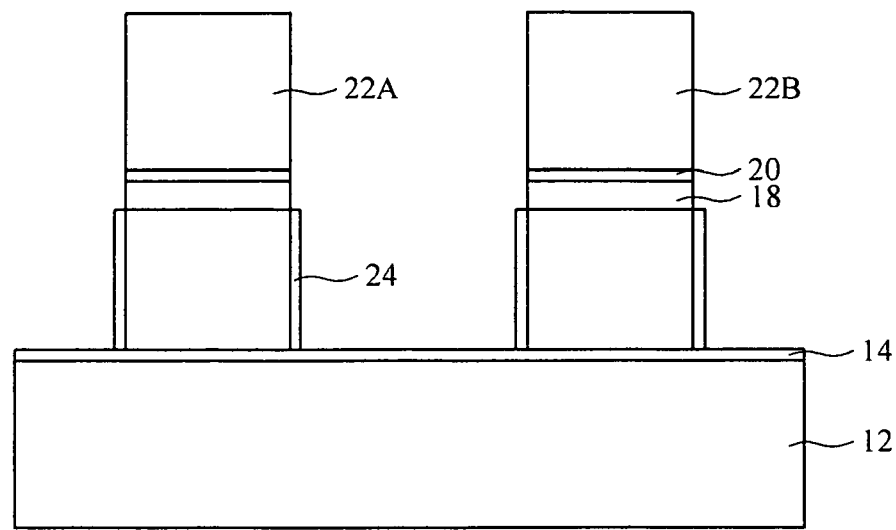

Referring to FIG. 1E, following the first overetch process, a second inert gas plasma treatment is carried out using one or more inert gases, followed by a second overetch process to preferably fully reveal the gate oxide layer 14. For example, the second in-situ inert gas plasma treatment is carried out according to the same preferred embodiments as the first in-situ inert gas plasma treatment, but preferably at a higher RF power, followed by a second overetch process carried out according to the same preferred embodiments as the first overetch process to complete the etching process.

In an important aspect of the invention, it has been found that the inert plasma treatments according to preferred embodiments, e.g., during at least the second inert gas plasma treatment, a silicon oxide containing passivation layer e.g., 24 is formed over the polysilicon gate electrode portions 16A and 16B sidewalls thereby preventing preferential etching in a subsequent overetch processes to complete the final etching step. For example, silicon oxide species are sputtered from exposed silicon oxide surfaces present such as in the reactor during the inert gas plasma treatment (e.g., second plasma treatment), such as exposed portions of the gate oxide, more preferably including from a silicon dioxide dielectric window portion of a DPS plasma reactor. To ensure sputtering from the silicon dioxide dielectric window, which is present for coupling RF energy into the plasma reactor as in FIG. 2, the second inert gas plasma treatment is preferably carried out at a higher power than the first inert gas plasma treatment. It will be appreciated that silicon oxide species may be sputtered during the first inert gas plasma treatment but preferably a silicon oxide passivation layer 24 is primarily formed during the second plasma treatment.

For example, the formation of a silicon oxide passivation layer e.g., 24 over the polysilicon gate electrode sidewall portions prior to a subsequent overetch process has been found to have the advantageous effect of preventing preferential etching leading to the formation of etching notches at the base portion of the polysilicon gate electrode (e.g., reduced gate electrode width). The formation of the silicon oxide passivation layer is particularly advantageous when simultaneously etching N and P doped polysilicon gate electrodes where notching (micro-trenching) is reduced or eliminated in a P-doped polysilicon gate while ensuring foot free formation of an N-doped polysilicon gate (removing substantially all polysilicon adjacent the gate electrode).

Following the multi-step RIE polysilicon gate etching process, conventional steps are then carried out to complete the formation of the CMOS devices, for example, ion implants to form halo or LDD implants, spacer formation along the polysilicon gate electrode sidewalls, ion implants to form the source and drain regions, removal of a remaining portions of the hardmask layer, and optionally, salicide formation to improve a source/drain contact resistance.

Figure 2:
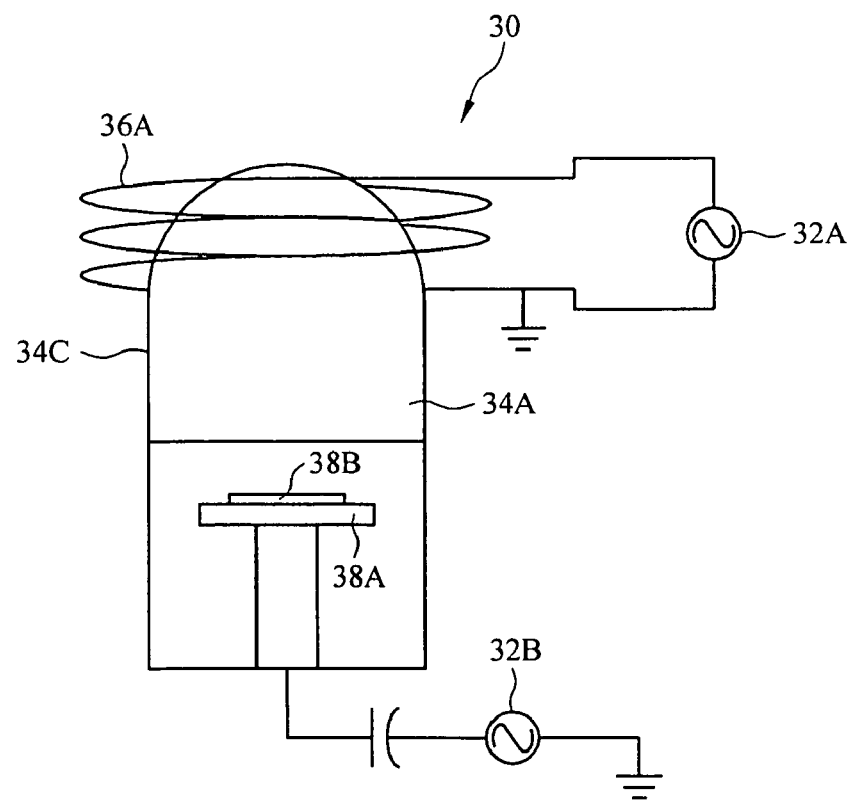
FIG. 2 is an exemplary plasma reactor for carrying out an embodiment of the present invention.

Referring now to FIG. 2, according to an embodiment of the invention, the multi-step RIE etching process is preferably carried out using a high density plasma formed by a transformer coupled plasma (TCP) source or inductively coupled plasma (ICP) source, also referred to as a dual source plasma (DSP) reactor e.g., 30, preferably including a silicon dioxide containing (e.g., quartz) dielectric window e.g., 34C. For example, the exemplary DPS plasma reactor shown in FIG. 2 includes an inductively coupled RF power source 32A (e.g., anode) provided to the upper chamber of the reactor 34A through an energy transmitting dielectric window e.g., silicon dioxide dome 34C as schematically indicated by RF power source inductive coil 36A. It will be appreciated that the dielectric window 34C may be in another shape including about co-planar with the wafer process surface. The wafer 38B is typically held onto a wafer pedestal 38A, by a vacuum force or electrostatic chuck.

The wafer pedestal 38A may also include a horizontally disposed cathode positioned parallel to a bottom portion of the wafer 38B for providing a bias power independent of the source power and supplied by capacitively coupled RF power source 32B. In a DPS plasma etching process, a power source frequency of up to about 13.5 MHZ and a bias frequency of 1 MHz to about 13.5 MHZ may be utilized.

A DPS plasma reactor, preferably including a $SiO_2$ containing dielectric window, is preferably used for the multi-step RIE etching process since the RF bias power is advantageously decoupled from the RF source power to allow an adjustably delivered RF bias power, importantly including zero bias power during inert gas plasma treatments according to preferred embodiments of the present invention. In addition, during the inert plasma gas treatments, preferably at zero bias power, the silicon oxide passivation layer formed over the polysilicon sidewalls of the gate electrode is believed to be aided by the sputtering effect of the inert gas ions to sputter out silicon oxide species such as SiOx, SiOxBr, and the like, from exposed silicon dioxide containing portions of the process wafer surface, e.g. gate oxide layer as well as the $SiO_2$ containing dielectric window.

Figure 3:
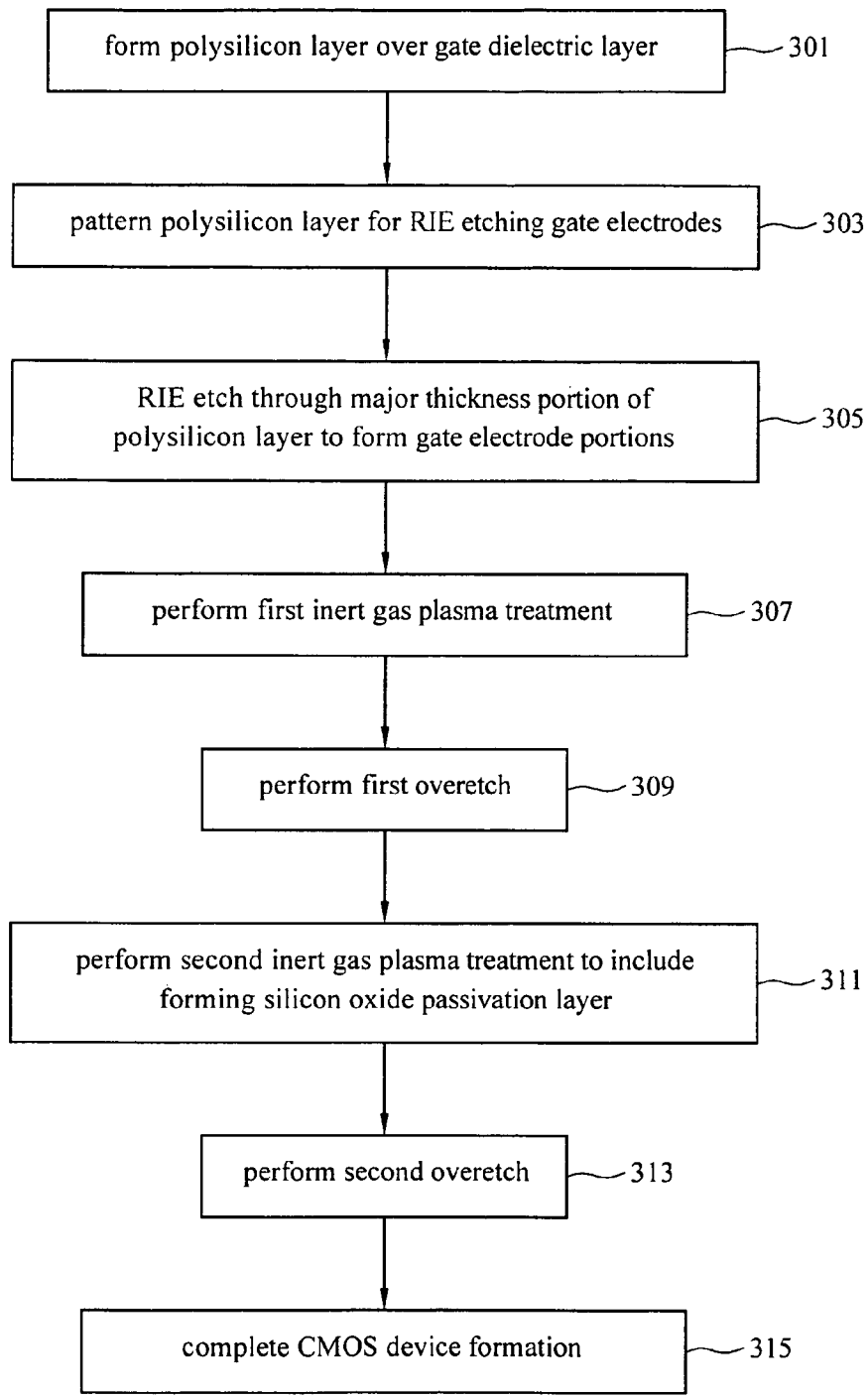
FIG. 3 is an exemplary process flow diagram including several embodiments of the present invention.

Referring to FIG. 3 is a process flow diagram including several embodiments of the present invention. In process 301 a polysilicon layer is formed on a gate dielectric layer. In process 303, a photolithographic patterning process is carried to pattern polysilicon layer for RIE etching of gate electrodes. In process 305, a major thickness portion of the polysilicon layer thickness is etched to form gate electrode portions. In process 307, a first inert gas plasma treatment is carried out according to preferred embodiments. In process 309, a first overetch process is carried out according to preferred embodiments. In process 311 a second inert gas plasma treatment is carried out according to preferred embodiments to include forming a silicon oxide passivation layer. In process 313, a second overetch process is carried out according to preferred embodiments. In process 315, conventional processes are carried out to complete the formation of the CMOS device.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma assisted etching of a gate electrode to avoid notching at a base portion comprising:
   providing a semiconducting substrate;
   forming a gate dielectric layer on the semiconducting substrate;
   forming a conductive layer on the gate dielectric;
   patterning a photoresist layer over the conductive layer for etching a gate electrode;
   carrying out a first plasma assisted etch process to etch through a major thickness portion of the conductive layer without exposing the gate dielectric layer;

then carrying out a first inert gas plasma treatment; and
then carrying out a second plasma assisted etch process to include exposing portions of the underlying gate dielectric layer.

2. The method of claim 1 further comprising:
carrying out a second inert gas plasma treatment; and,
carrying out a third plasma assisted etch process to fully expose the underlying gate dielectric layer adjacent either side of the gate electrodes.

3. The method of claim 1, wherein the conductive layer comprises polysilicon layer.

4. The method of claim 3, wherein a silicon oxide containing passivation layer is formed over exposed polysilicon layer portions during the second inert gas plasma treatment.

5. The method of claim 2, wherein the first and second inert gas plasma treatments are carried out using zero RF bias power.

6. The method of claim 2, wherein the second and third plasma assisted etch processes are carried out using zero RF bias power.

7. The method of claim 2, wherein the first, second, and third plasma assisted etch processes and the first and second inert gas plasma treatments are carried out in-situ in a plasma reactor comprising a decoupled RF source power and RF bias power.

8. The method of claim 7, wherein the plasma reactor comprises a silicon dioxide dielectric RF window to provide sputtered silicon oxide species during the second inert gas plasma treatment.

9. The method of claim 3, wherein the polysilicon layer comprises at least one of N-doped and P-doped polysilicon.

10. The method of claim 2, wherein the first and second inert gas plasma treatments consist essentially of inert gases selected from the group consisting of argon, helium, and neon.

11. The method of claim 2, wherein the second and third plasma assisted etch processes comprise a chlorine-free etching chemistry.

12. The method of claim 11, wherein the chlorine-free etching chemistry is selected from the group consisting of $HBr/O_2$ and $CF_4/O_2$.

13. The method of claim 1, wherein the first plasma assisted etch process comprises an etching chemistry selected from the group consisting of $HBr/Cl_2/O_2/He$, $HBr/Cl_2/He$, $CF_4/Cl_2/O_2$, and $CF_4/O_2$.

14. The method of claim 1, wherein the gate dielectric layer is selected from the group consisting of $SiO_2$, nitrogen doped $SiO_2$, silicon nitride, and high-K dielectrics having a dielectric constant of greater than about 10.

15. The method of claim 3, further comprising a hardmask layer formed on the polysilicon layer prior to the step of patterning wherein the hardmask layer is selected from the group consisting of silicon oxide, silicon nitride, and silicon oxynitride.

16. A method for plasma assisted etching a conductive layer to avoid notching at a base portion comprising:
providing a semiconducting substrate;
forming a gate dielectric layer on the semiconducting substrate;
forming a conductive layer on the gate dielectric layer;
forming a hardmask layer on the conductive layer;
patterning a photoresist layer over the conductive layer for etching a gate electrode;
carrying out a main etch process comprising a plasma reactor to etch through a major thickness portion of the conductive layer without exposing the gate dielectric layer;
then carrying out a first inert gas plasma treatment in-situ with less than 200 W RF bias power;
then carrying out a first overetch process in-situ to include exposing portions of the underlying gate dielectric layer;
carrying out a second inert gas plasma treatment in-situ with less than 200 W RF bias power to form a silicon oxide containing passivation layer over exposed conductive layer portions; and,
carrying out a second overetch process in-situ.

17. The method of claim 16, wherein the plasma reactor comprises a silicon dioxide dielectric RF window to provide sputtered silicon oxide species during the second inert gas plasma treatment.

18. The method of claim 16, wherein the conductive layer comprises polysilicon layer.

19. The method of claim 18, wherein the polysilicon layer comprises doped polysilicon selected from the group consisting of N-doped and P-doped polysilicon.

20. The method of claim 16, wherein the less than 200 W RF bias power comprises zero RF bias power.

21. The method of claim 16, wherein the first and second inert gas plasma treatments consist essentially of inert gases selected from the group consisting of argon, helium, and neon.

22. The method of claim 16, wherein the first and second overetch processes are carried out with a chlorine-free etching chemistry.

23. The method of claim 22, wherein the chlorine-free etching chemistry is selected from the group consisting of $HBr/O_2$ and $CF_4/O_2$.

24. The method of claim 16, wherein the first plasma assisted etch process comprises an etching chemistry selected from the group consisting of $HBr/Cl_2/O_2/He$, $HBr/Cl_2/He$, $CF_4/Cl_2/O_2$, and $CF_4/O_2$.

25. The method of claim 16, wherein the gate dielectric layer is selected from the group consisting of $SiO_2$, nitrogen doped $SiO_2$, silicon nitride, and high-K dielectrics having a dielectric constant of greater than about 10.

26. The method of claim 16, further comprising a hardmask layer formed on the polysilicon layer prior to the step of patterning wherein the hardmask layer is selected from the group consisting of silicon oxide, silicon nitride, and silicon oxynitride.

27. The method of claim 16, wherein the semiconducting substrate comprises a material selected from the group consisting of silicon, polysilicon, strained semiconductor, compound semiconductor, and multi-layered semiconductors.

* * * * *